(12) United States Patent
Mizusako et al.

(10) Patent No.: US 7,651,822 B2
(45) Date of Patent: Jan. 26, 2010

(54) METHOD OF MANUFACTURING GRAY SCALE MASK AND MICROLENS, MICROLENS, SPATIAL LIGHT MODULATING APPARATUS AND PROJECTOR

(75) Inventors: Kazuhisa Mizusako, Chino (JP); Shunji Kamijima, Hana-mura (JP)

(73) Assignee: Seiko Epson Corporation, Tokyo (JP)

( * ) Notice: Subject to any disclaimer, the term of this patent is extended or adjusted under 35 U.S.C. 154(b) by 412 days.

(21) Appl. No.: 11/564,078

(22) Filed: Nov. 28, 2006

(65) Prior Publication Data

US 2007/0122718 A1 May 31, 2007

(30) Foreign Application Priority Data

Nov. 30, 2005 (JP) ............... 2005-345290

(51) Int. Cl.
*G03F 1/00* (2006.01)
(52) U.S. Cl. .......................... 430/5; 430/311
(58) Field of Classification Search .................. 430/5, 430/311, 50
See application file for complete search history.

(56) References Cited

U.S. PATENT DOCUMENTS

| 4,080,267 | A | * | 3/1978 | Castellani et al. ............... 430/5 |
| 5,416,561 | A | * | 5/1995 | Sawano et al. ................. 355/43 |
| 2005/0130045 | A1 | | 6/2005 | Ozawa |
| 2005/0233228 | A1 | * | 10/2005 | Fijol et al. ..................... 430/50 |
| 2006/0088770 | A1 | * | 4/2006 | Tan et al. ........................ 430/5 |
| 2009/0044166 | A1 | | 2/2009 | Ozawa |

FOREIGN PATENT DOCUMENTS

| JP | T-08-504515 | 5/1996 |
| JP | 2002-278079 | 9/2002 |
| JP | 2005-165248 | 6/2005 |
| WO | WO 2005/060362 A2 | 7/2005 |

* cited by examiner

*Primary Examiner*—Mark F Huff
*Assistant Examiner*—Rashid Alam
(74) *Attorney, Agent, or Firm*—Oliff & Berridge PLC

(57) ABSTRACT

A gray scale mask having distribution of light transmittance determined for the purpose of exposing a resist layer with a predetermined pattern, wherein the distribution of the light transmittance is determined so that the resist layer having been exposed in accordance with a first resist shape would be used to form a second resist shape with an aspect ratio higher than the aspect ratio of the first resist shape.

10 Claims, 15 Drawing Sheets

F I G. 2
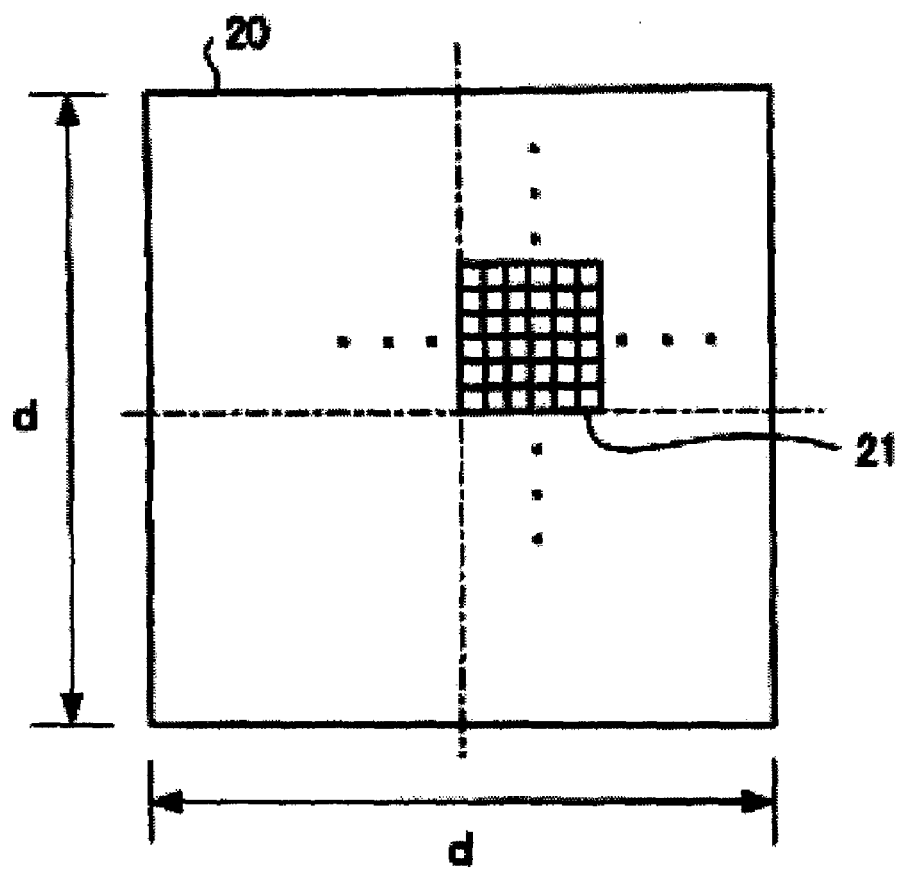

F I G. 3
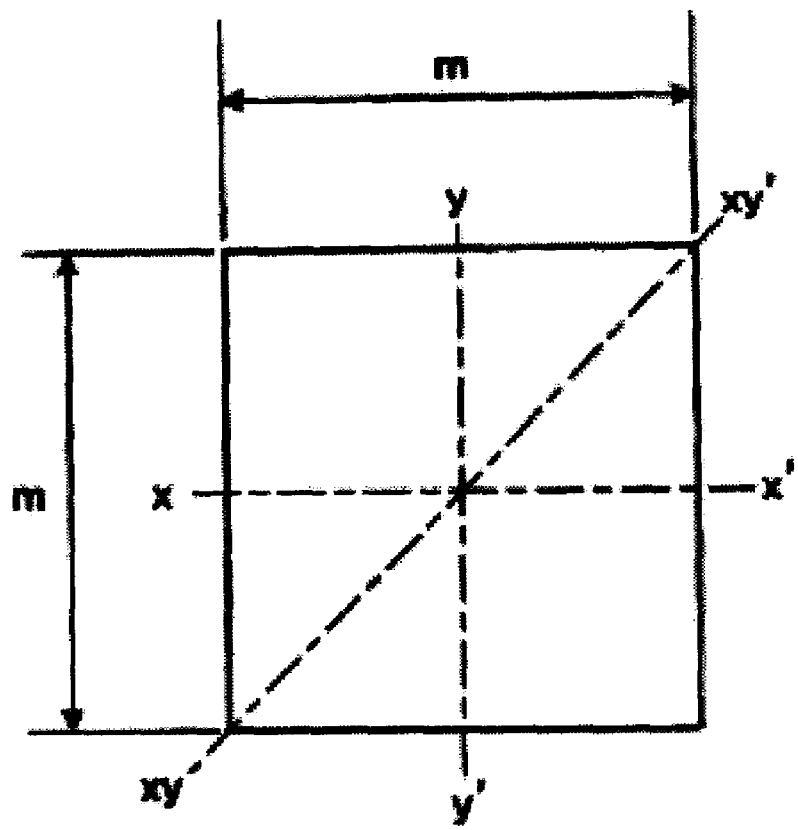

F I G. 4
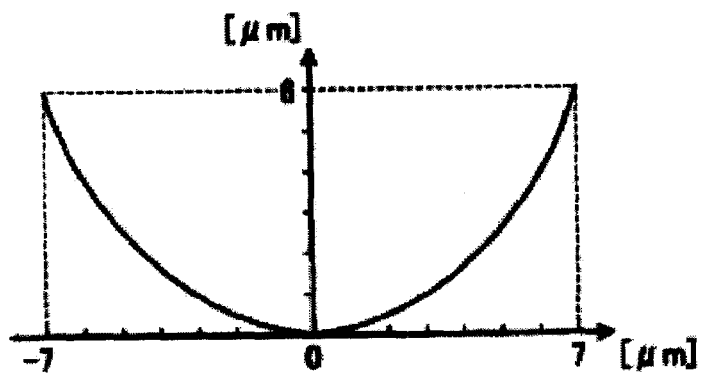
F I G. 5
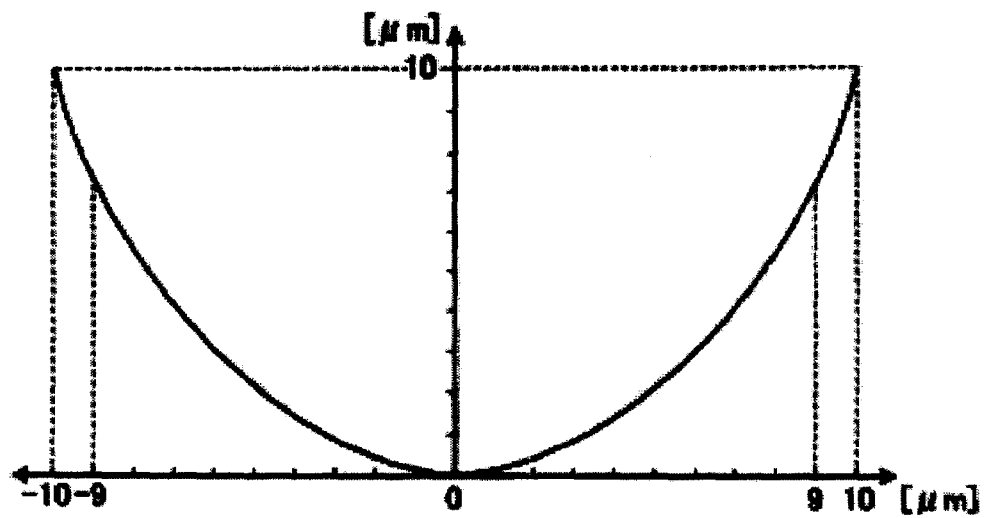

FIG. 10
PROCESS a
PROCESS b
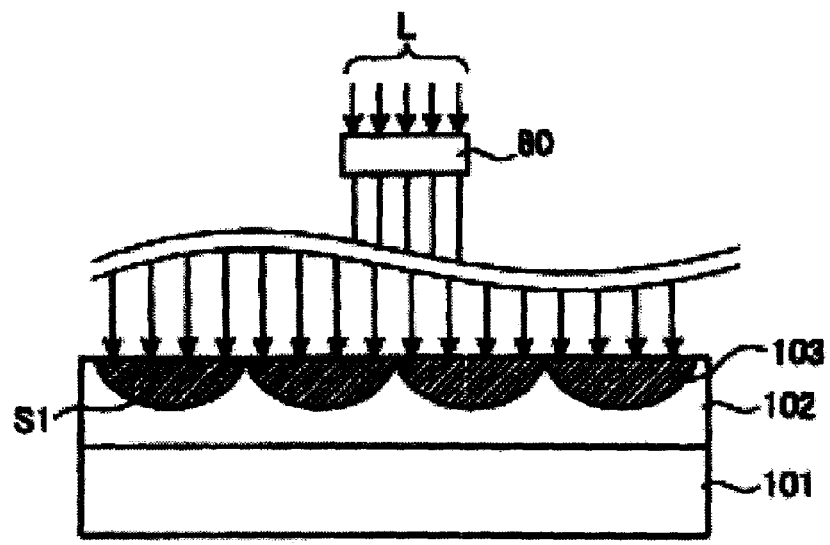
PROCESS c
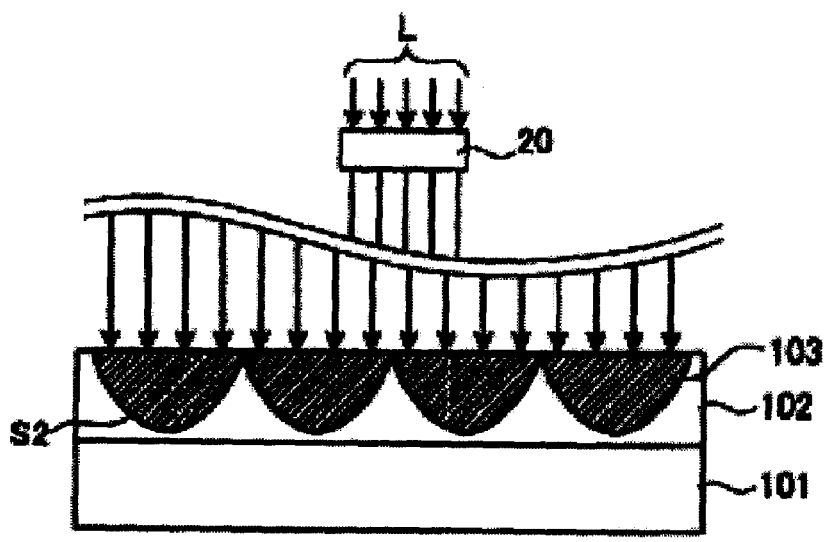

F I G. 1 1
PROCESS d
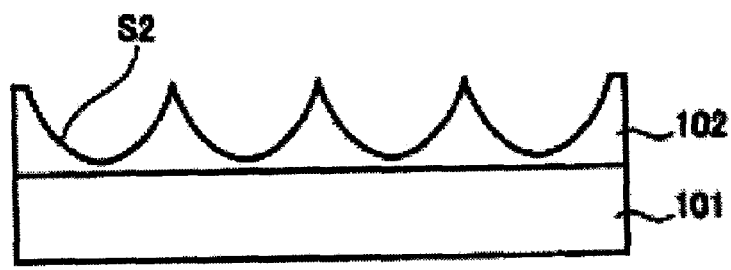
PROCESS e
PROCESS f
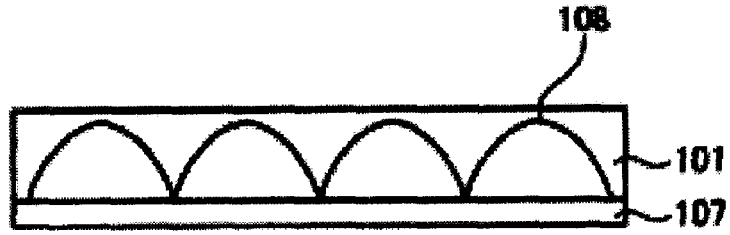

METHOD OF MANUFACTURING GRAY SCALE MASK AND MICROLENS, MICROLENS, SPATIAL LIGHT MODULATING APPARATUS AND PROJECTOR

BACKGROUND

1. Technical Field

The present invention relates to a method of manufacturing a gray scale mask and a microlens, a microlens, a spatial light modulating apparatus and a projector, particularly, a technology of a gray scale mask for manufacturing an optical element having a three-dimensional microstructure such as a microlens.

2. Related Art

Up to now, in manufacturing an optical element having a three-dimensional microstructure, used has been a photolithography technology, for example. The photolithography is a technology of applying a resist layer, which is a photosensitive material having a photoreactive characteristic, on a substrate to carry out exposure and development for the purpose of forming a pattern in the resist layer. As a method of forming a desired pattern in a resist layer, used is a technology of exposing a resist through a gray scale mask, for example. The gray scale mask includes plural unit cells whose light transmittance is set so as to correspond to a desired shape of a resist. The light transmittance of a unit cell can be set in accordance with an area aperture rate, which is a rate of the area of an opening in a unit cell, for example. A technology of using a gray scale mask whose light transmittance is set in accordance with the area of an opening is proposed in JP-T-H08-504515, for example.

Depth distribution of a resist shape formed in a resist layer corresponds to distribution of light transmittance in a gray scale mask. It is difficult in some cases to form the resist shape having a high aspect ratio, the aspect ratio being a ratio of the depth to the width, since the light transmittance capable of setting for the gray scale mask is limited in range. Further, it is necessary to form a part of the resist shape corresponding to the vicinity of the outer periphery of a microlens with high accuracy in order to form a microlens capable of efficiently guiding light. On the other hand, a part where the resist depth greatly varies in the two-dimensional direction is extremely difficult to accurately control the resist depth. Accordingly, even a part considered to have a great influence on a performance of the microlens is difficult to be formed with high accuracy. Especially, the higher the aspect ratio of the resist shape is, the larger a range of the resist depth should be made. This causes deterioration in accuracy. As described above, the usual technology has a problem that an optical element having a three-dimensional microstructure such as a microlens is difficult to be formed with high accuracy in some cases.

SUMMARY

An advantage of some aspects of the invention is to provide a method of manufacturing a gray scale mask for forming an optical element having a three-dimensional microstructure such as a microlens, particularly, an optical element having the shape with a high aspect ratio, and manufacturing a microlens, and to provide a microlens, a spatial light modulating apparatus and a projector.

A gray scale mask according to an aspect of the invention is a gray scale mask having distribution of light transmittance determined for the purpose of exposing a resist layer with a predetermined pattern, wherein the distribution of the light transmittance is determined so that the resist layer having been exposed in accordance with a first resist shape would be used to form a second resist shape with an aspect ratio higher than the aspect ratio of the first resist shape.

The aspect ratio is defined to be a ratio of the depth to the width of a resist shape. A gray scale mask usually used can be used for exposure corresponding to the first resist shape. Using the gray scale mask in accordance with the aspect of the invention for forming the second resist shape on the basis of the first resist shape allows the resist depth to be gained more. Gaining deeper resist depth allows the shape having a higher aspect ratio than the case of using only one gray scale mask to be formed. Further, exposure corresponding to the first shape and exposure for forming the second shape on the basis of the first shape are used to determine the resist depth, so that the accuracy in controlling the resist depth can be improved. For example, it is possible to make distribution of the resist depth in the two-dimensional direction accurate and stable in a part of the resist shape corresponding to the vicinity of the outer periphery of the microlens. This allows a gray scale mask capable of forming with high accuracy an optical element having a three-dimensional microstructure such as a microlens, particularly, an optical element in the shape having a high aspect ratio to be obtained.

A preferred aspect of the invention is a gray scale mask including: a first area having the light transmittance varied in accordance with the second resist shape; and a second area for intercepting light for exposing the resist layer. A part of the resist layer having been exposed in accordance with the first shape, the part on which the light having penetrated the first area of the gray scale mask is incident, is only exposed. This allows the second resist shape having the resist depth deep in a desired part to be formed.

Another preferred aspect of the invention is a gray scale mask including plural unit cells provided with an opening part and a light shielding part, wherein the light transmittance is determined in accordance with an aperture area rate, the aperture area rate being a rate of the area of the opening part for the unit cell, the gray scale mask including: a first area having the aperture area rate of the unit cell varied in accordance with the second resist shape; and a second area having the unit cell with the area aperture rate in a range other than a range, the latter range where the area aperture rate and the resist depth are in a substantially proportional relation. This allows the second resist shape having the resist depth deep in a desired part to be formed. Further, a microtrench can be prevented from being formed between an area on which the light having penetrated the first area is incident and an area on which the light having penetrated the second area is incident, so that the second resist shape can be formed with further higher accuracy.

A further another preferred aspect of the invention is a gray scale mask including a mask area for forming the second resist shape, wherein the first area is formed in a part of the mask area, the part being enclosed by an inscribed circle in the mask area. This allows a gray scale mask for forming an optical element having the shape whose center part is higher than the surrounding part to be obtained.

Another preferred aspect of the invention is a gray scale mask including plural mask areas for respectively forming the second resist shape, wherein the first area is formed in a part of one mask area, the part being enclosed by an arc of a circumscribed circle about another mask area adjacent to the former mask area. This allows a gray scale mask for forming an optical element having the shape whose center part is higher than the surrounding part to be obtained.

Another preferred aspect of the invention is a gray scale mask including a mask area for forming the second resist shape, wherein the first area is formed in a part of an inscribed circle in the mask area. This allows a gray scale mask for forming an optical element having the shape whose center part is higher than the surrounding part to be obtained.

Furthermore, according to another aspect of the invention, it is possible to provide a method of manufacturing a microlens, the method including: first exposing a resist layer with a first gray scale mask having distribution of light transmittance determined in accordance with a first resist shape; second exposing the resist layer with a second gray scale mask having distribution of light transmittance determined so that a second resist shape having an aspect ratio higher than the aspect ratio of the first resist shape would be formed by means of the resist layer having been exposed in accordance with the first resist shape; and forming a lens shape by transcribing the second resist shape to another member. Using the first gray scale mask and the second gray scale mask allows the shape with the aspect ratio higher than the case of using only one gray scale mask to be formed. Further, using the first gray scale mask and the second gray scale mask allows a part of the resist shape, which corresponds to the vicinity of the outer circumference of a microlens, to be formed stably with accurate depth distribution. Accordingly, a microlens, particularly, a microlens having the shape with a high aspect ratio can be formed with high accuracy.

According to another aspect of the invention, it is possible to provide a microlens manufactured with the gray scale mask. Exposure with the gray scale mask allows the resist shape to be formed with high accuracy, so that a microlens formed with high accuracy and capable of accurately controlling a direction that the light progresses can be obtained.

Moreover, according to another aspect of the invention, it is possible to provide a microlens manufactured in the method of manufacturing a microlens. This allows a microlens formed with high accuracy and capable of accurately controlling a direction that the light progresses to be obtained.

In addition, according to another aspect of the invention, it is possible to provide a spatial light modulating apparatus including the microlens. Including the microlens allows the light to be efficiently used by means of the microlens having the accurate shape. Accordingly, a spatial light modulating apparatus capable of efficiently using light and for obtaining an image, which is highly efficient and bright and having a high contrast, can be obtained.

Further, according to another aspect of the invention, it is possible to provide a projector including the spatial light modulating apparatus. Using the spatial light modulating apparatus allows a projector capable of displaying an image, which is highly efficient and bright and having a high contrast, to be obtained.

BRIEF DESCRIPTION OF THE DRAWINGS

The invention will be described with reference to the accompanying drawings, wherein like numbers reference like elements.

FIG. 2 illustrates a structure of a gray scale mask in accordance with Embodiment 1 of the invention.

FIG. 3 illustrates a shape of a microlens.

FIG. 4 illustrates a shape of a microlens.

FIG. 5 illustrates a shape of a microlens.

FIG. 10 illustrates processes of manufacturing a microlens.

FIG. 11 illustrates processes of manufacturing a microlens.

DESCRIPTION OF EXEMPLARY EMBODIMENTS

Embodiments of the invention will be described in detail hereinafter, made reference to the drawings.

Embodiment 1

Figure 1:
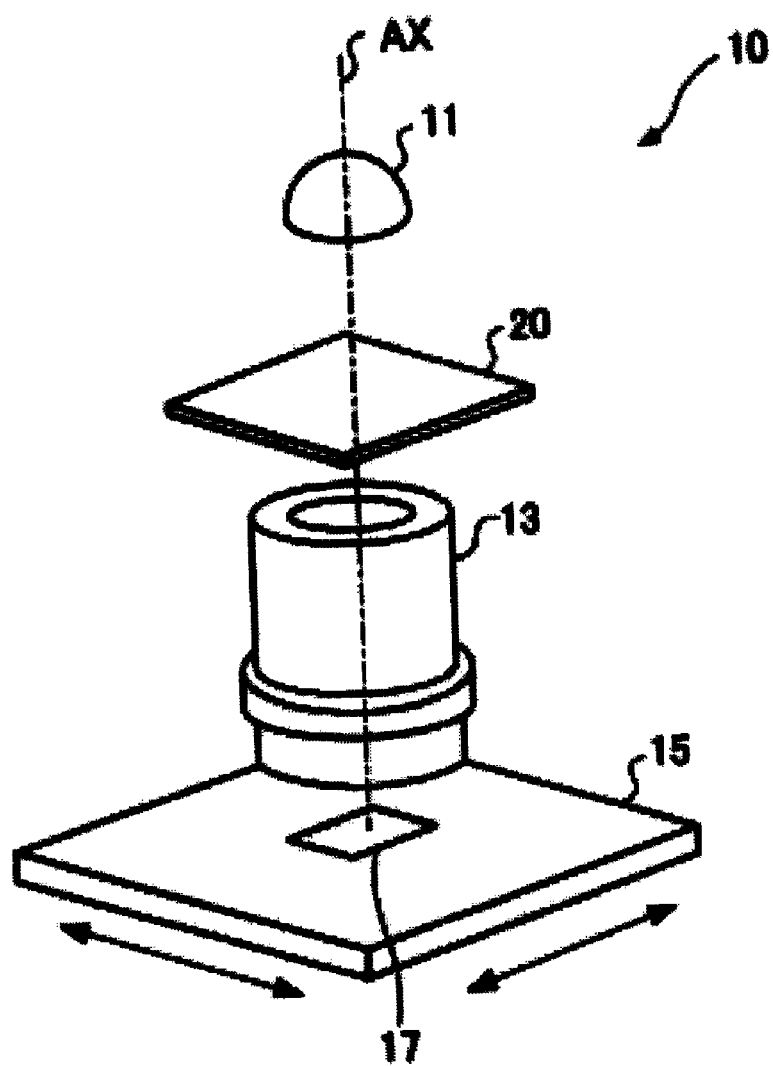
FIG. 1 shows a structure of a reduction projection aligner using a gray scale mask.

FIG. 1 illustrates a gray scale mask 20 in accordance with Embodiment 1 of the invention. FIG. 1 shows a structure of a reduction projection aligner 10 using the gray scale mask 20. The reduction projection aligner 10 is for reducing the light from the gray scale mask 20 to expose a material board 17. Distribution of a light transmittance of the gray scale mask 20 is determined for the purpose of exposing a resist layer with a predetermined pattern. The gray scale mask 20 is provided on an optical axis AX of an optical system of the reduction projection aligner 10 and between a light source 11 and a projection lens 13. The light from the light source 11 is incident on the projection lens 13 having a reduction magnification after penetrating the gray scale mask 20. The light from the projection lens 13 is incident on the material board 17 placed on a stage 15. The reduction projection aligner 10 is a g-line stepper using a g-line, which is a light having 435 nm of wavelength, for example.

FIG. 2 illustrates a structure of the gray scale mask 20. The gray scale mask 20 for forming a single microlens will be described here. In the case of forming a microlens array in which plural microlenses are arranged in the shape of an array, used can be the gray scale mask 20 shown in FIG. 2, which is arranged in the shape of an array. The gray scale mask 20 is in the shape of a square having 70 μm of the side length d. When the reduction projection aligner 10 is used for carry out exposure of one-fifth reduction, for example, using the gray scale mask 20 with 70 μm of the side length d allows a microlens whose side is 14 μm to be formed.

The gray scale mask 20 is formed from plural unit cells 21, which have respectively the shape of a square having 2.5 μm of side length and which are arranged in that shape of an array. The light transmittance of the respective plural unit cells 21 is set so as to correspond to the desired resist shape. Arranging the unit cells 21, which respectively have the set light transmittance, in the shape of an array allows the resist shape having a three-dimensional microstructure to be formed. One gray scale mask 20 includes 784 (=28×28) unit cells 21.

The unit cell 21 has an opening part and a light-shielding part both of which are not shown. The opening part transmits the light from the light source 11 of the reduction projection aligner 10 (refer to FIG. 1). The opening part is formed from minute cells transmitting light. The light-shielding part intercepts the light from the light source 11. The light-shielding part is formed from minute cells intercepting light. The light transmittance of the unit cell 21 is determined on the basis of the area aperture rate. The area aperture rate is a rate of the area of the opening part in the unit cell 21.

FIGS. 3 to 5 illustrate the shape of a microlens formed with the gray scale mask in accordance with the embodiment of the invention. The microlens is formed in a square area whose side length m is 14 μm as shown in FIG. 3. A graph shown in FIG. 4 shows a curved surface of the microlens in a section taken along a line xx' in FIG. 3. The microlens is 6 μm in height from the top to the bottom in the section along the line xx'. The graph shown in FIG. 5 shows a curved line of the microlens in a section taken along a line xyxy' in FIG. 3. The microlens is 10 μm in height from the top to the bottom in the section along the line xyxy'. The microlens has an aspherical shape having different curvatures in two directions crossing at a right angle.

Figure 6:
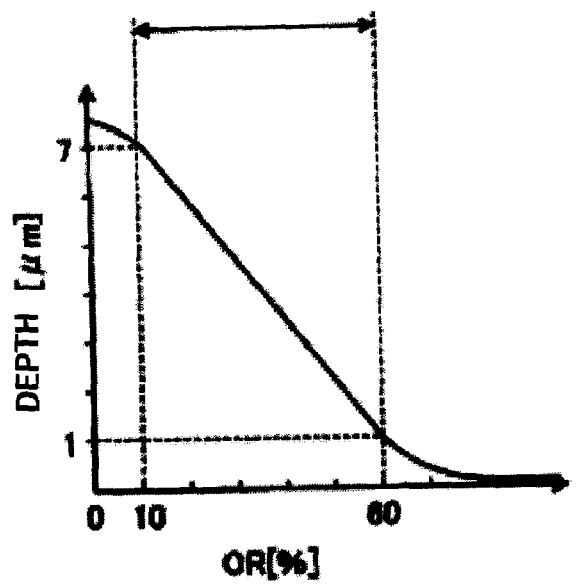
FIG. 6 is a graph showing an example of a γ characteristic.

FIG. 6 shows an example of a γ characteristic. The γ characteristic shows a relation between the area aperture rate OR and the depth of the resist shape formed in the resist layer by exposure. The depth of the resist shape in Embodiment 1 is assumed to be zero at a place farthest from the surface of the resist layer on the light source 11 side, in other words, at a point corresponding to the top of the microlens and to become larger in value at a place closer to the surface on the light source 11 side. The depth of the resist shape can be measured by means of a laser microscope, an atomic force microscope, an interference optical measuring instrument or a scanning electron microscope. Plotting the depth of the resist shape in the case of setting the area aperture rate OR at each value allows the γ characteristic to be obtained. An example of using a positive resist AZP4903 made by Clariant in Japan as a resist material is described in Embodiment 1. An exposed part of the positive resist is removed in development. The larger the area aperture rate OR is, the smaller the depth of the resist shape is. On the other hand, the smaller the area aperture rate OR is, the larger the depth of the resist shape is.

In order to form the resist shape into the accurate height in accordance with variation of the area aperture rate OR, it is preferred to make gradation in a range in which the γ characteristic shows straight variation in accordance with variation in area aperture rate OR, in a range of 10% to 60% of the area aperture rate OR, for example. It is also preferred to select for the resist a material whose γ characteristic shows straight variation. The resist material selected in Embodiment 1 has 6 μm of resist depth in a range of 10 to 60% of the area aperture rate OR. Gradation in the range in which the γ characteristic shows straight variation allows the resist depth to be accurately controlled, and thereby, a microlens with high accuracy to be formed.

Figure 7:
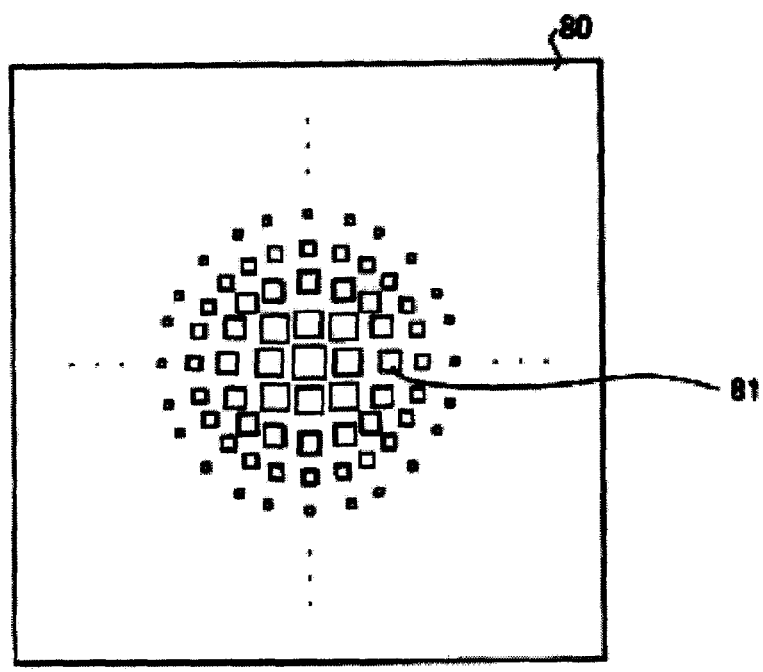
FIG. 7 illustrates a first gray scale mask.

FIG. 7 illustrates a gray scale mask 80 for exposing the resist layer in accordance with the first resist shape. The gray scale mask 80 is a first gray scale mask used in the first exposing process. The first gray scale mask 80 has a structure similar to the gray scale mask 20 in accordance with the embodiment of the invention, which has been described with reference to FIG. 2. In FIG. 7, distribution of light transmittance of the gray scale mask 80 is schematically shown, using an opening part 81. It is shown that the larger the opening part 81 is, the larger the light transmittance is. The first gray scale mask 80 has distribution of light transmittance such that the light transmittance is largest at the center point and becomes lower at a point away from the center point. As described above, the first gray scale mask 80 has the distribution of the light transmittance similar to that of the usual gray scale mask for forming a microlens.

Figure 8:
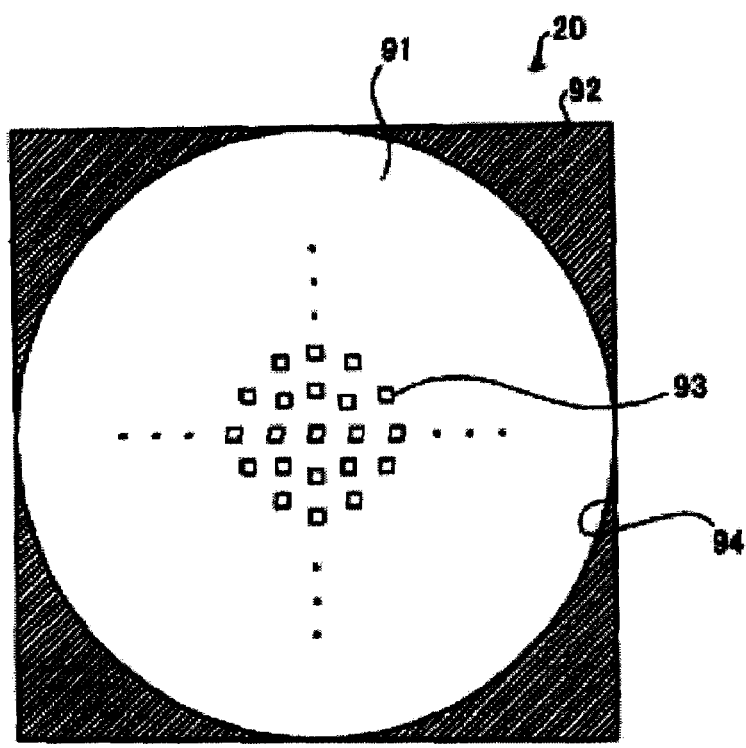
FIG. 8 illustrates a second gray scale mask.

FIG. 8 illustrates a second gray scale mask 20, which is the gray scale mask in accordance with the embodiment of the invention. The second gray scale mask 20 is for forming the second resist shape with the resist layer having been exposed in accordance with the first resist shape. The second gray scale mask 20 has a first area 91 and a second area 92. The second gray scale mask 20 has a square-shaped mask area for forming the second resist shape. The first area 91 is formed in a part enclosed by an inscribed circle 94 inscribed in the square shape of the mask area. The second area 92 is a part other than the first area 91 in the mask area. Including the first area 91 having such a shape allows a microlens to be formed into such a shape that the center part is higher than the peripheral part.

The first area 91 has distribution of the light transmittance for forming the second resist shape with the resist layer having been exposed in accordance with the first resist shape. The area of an opening part 93 formed in the first area 91 is adjusted so that the second resist shape would be formed on the basis of a sum of the light quantity in the case of using the first gray scale mask 80 and the light quantity in the case of using the second gray scale mask 20. On the other hand, the second area 92 intercepts the light from the light source 11. Accordingly, in the case of using the second gray scale mask 20, exposed is only a circular area of the resist layer corresponding to the first area 91.

Figure 9:
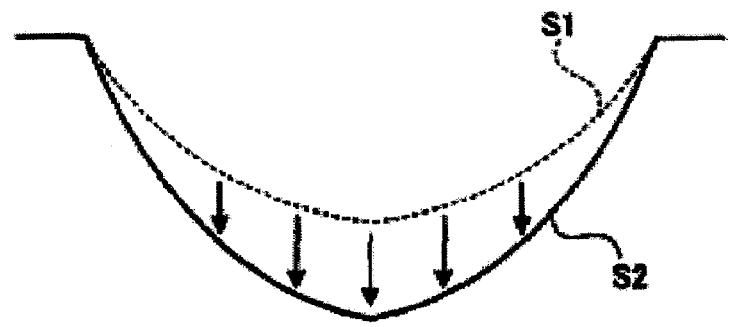
FIG. 9 illustrates a first resist shape and a second resist shape.

FIG. 9 illustrates the first resist shape S1 and the second resist shape S2. The resist shapes S1 and S2 shown in FIG. 9 correspond to the section along the line xyxy' of the square area shown in FIG. 3. The second resist shape S2 formed by exposure with the second gray scale mask 20 is deeper than the first resist shape S1. As described above, exposure using the second gray scale mask 20 in accordance with the embodiment of the invention allows the second resist shape S2 having the aspect ratio higher than that of the first resist shape S1 to be formed. The aspect ratio in the above context is defined to be a ratio of the depth to the width of a resist shape.

Using the gray scale mask in accordance with the embodiment of the invention for forming the second resist shape S2 on the basis of the first resist shape S1 allows the depth of the resist to be deepened. Deepening the depth enables formation of the shape with higher aspect ratio than the case of using only one gray scale mask.

A part of the resist shape whose resist depth largely varies in the two-dimensional direction is extremely difficult to accurately control the resist depth. In the case of a lens shape shown in FIG. 5, a part 9 to 10 μm away from the center point of the microlens greatly varies in resist depth in a direction of the diameter of the microlens. In the case that the shape of a part close to the outer periphery of the microlens is not accurate, the efficiency in advancing the incident light on the microlens in a predetermined direction is often deteriorated. Accordingly, in order to form a microlens having high performance, a part of the resist shape corresponding to the outer periphery of the microlens should be accurately formed.

In the case of using the gray scale mask 20 in accordance with the embodiment of the invention, the resist depth is determined on the basis of exposure corresponding to the first shape S1 and exposure for forming the second shape S2 based on the first shape S1. Reducing dispersion in resist depth by using plural gray scale masks allows the accuracy in controlling the resist depth to be improved, so that the distribution of the resist depth in the two-dimensional direction can be made accurate and stable. Accordingly, there is an effect that an optical element having a three-dimensional microstructure such as a microlens, particularly, an optical element in the shape with a high aspect ratio can be formed with high accuracy.

For the purpose of forming the gray scale mask 20, a light shielding film is first formed on a transparent substrate, which is a parallel and flat plate. For the transparent substrate, used can be a quartz substrate, for example. In the gray scale mask 20 in Embodiment 1, formed is a light shielding film, using chromium, which is used as a light shielding member. The opening part 93 is then formed on the transparent substrate on which the light shielding film is formed by electronic beam (EB) drawing or the like. A part of the unit cell 21 other than the part in which the opening part 93 is formed is the light shielding part. The reduction projection aligner for forming the gray scale mask 20 is an i-line stepper using i-line, which is the light having 365 nm of wavelength, for example.

FIGS. 10 and 11 illustrate processes of manufacturing a microlens by means of the gray scale mask 20 in accordance with the embodiment of the invention. First, in a process "a" shown in FIG. 10, formed is a resist layer 102 on a substrate 101. Applying a resist material on the substrate 101 to pre-bake the same allows the resist layer 102 to be formed. Next, in a process "b", used is a g-line stepper, which is a reduction projection aligner 10 shown in FIG. 1, to expose the resist layer 102 through the first gray scale mask 80. The resist layer 102 is exposed to the light L, which has penetrated the gray scale mask 20 and which is reduced into substantially one fifth. The process "b" is a first exposing process for carrying out exposure with the first gray scale mask 80 whose distribution of the light transmittance is determined in accordance with the first resist shape S1. In the process "b", formed is an exposure area 103 having the first resist shape S1.

After the first exposing process, the second gray scale mask 20 is mounted to the reduction projection aligner 10 instead of the first gray scale mask 80. In a process "c", the resist layer 102 is exposed through the second gray scale mask 20 by means of the reduction projection aligner 10. The process "c" is a second exposing process for exposing the resist layer 102, which has been exposed in accordance with the first resist shape S1, with the second gray scale mask 20 whose distribution of the light transmittance is determined so as to form the second resist shape S2. In the process "c", formed is the exposing area 103 having the second resist shape S2 whose aspect ratio is higher than that of the first resist shape S1.

In a process "d" shown in FIG. 11, developing the resist layer 102 with a developer after the second exposing process allows the second resist shape S2 to be formed in the resist layer 102. The resist layer 102 having been developed undergoes post-baking to be further cured. The desired resist shape S2 is thus formed in the resist layer 102.

Then, the resist layer 102 and the substrate 101 are etched in a process "e". Etching the resist layer 102 and the substrate 101 causes the second resist shape S2 of the resist layer 102 to be transcribed to the substrate 101. Transcription of the second resist shape S2 to the substrate 101 allows a lens shape 106 substantially same as the second resist shape S2 to be formed on the substrate 101. The process "e" is a lens shape forming process for forming the lens shape 106 by transcribing the second resist shape S2 to the substrate 101, which is a member different from the second resist shape S2. Etching to be carried out is dry etching or a combination of dry etching and wet etching.

Finally, in a process "f", filled is a lens shape part between the substrate 101 and a cover glass 107 with a transparent resin material to form a microlens 108. Die transcription using a die may be used for forming a microlens array having plural microlenses 108. In order to manufacture the die, non-electrolytic Ni plating is performed for the second resist shape S2 or the lens shape 106. The shape of the die is then die-transcribed to another member, acrylic resin or such, for example, to form a replica. This allows a large quantity of replicas to be easily manufactured. Injection molding using the microlens 108 as a mold may be used for forming an optical element. The gray scale mask 20 in accordance with the embodiment of the invention can be used not only for a microlens used in a spatial light modulating apparatus for modulating light in accordance with an image signal but also for manufacturing another optical element such as a microprism, a communication device and a medical device.

In manufacturing a microlens, exposure may be performed with a gray scale mask other than the first gray scale mask 80 and the second gray scale mask 20 and is not limited to the case using only two gray scale masks 80 and 20. Further exposure using another gray scale mask allows the shape with further higher aspect ratio to be formed with high accuracy.

Figure 12:
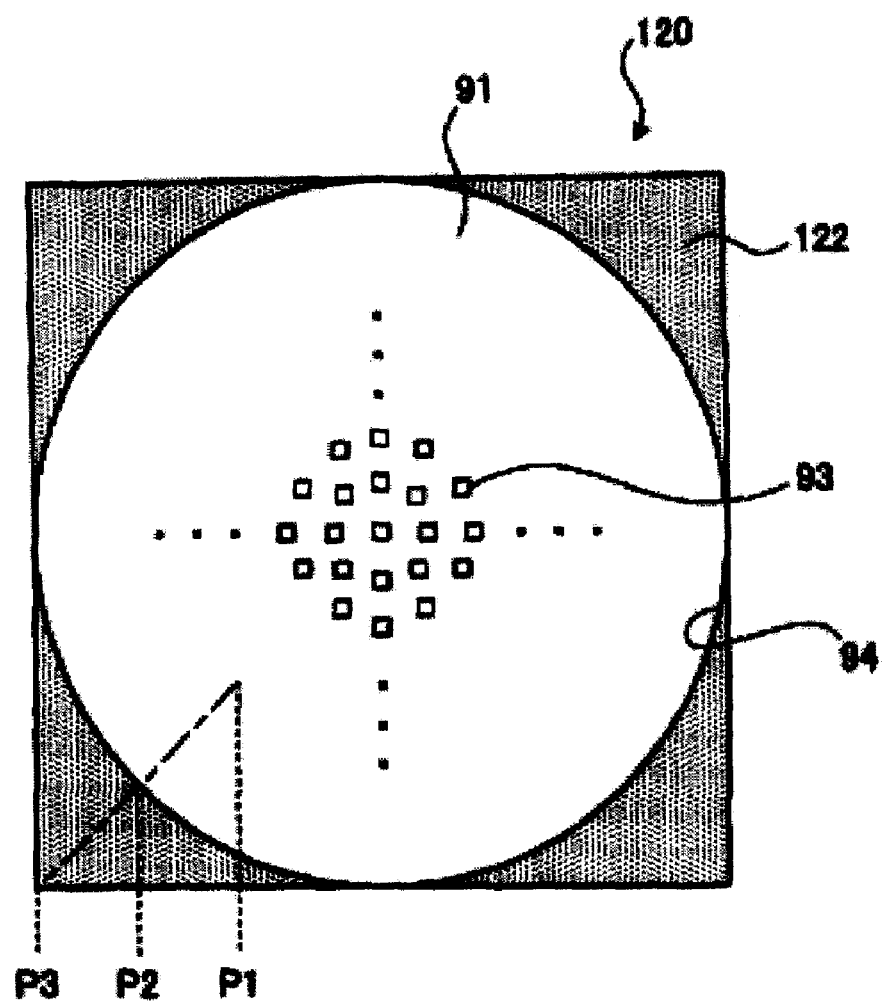
FIG. 12 illustrates a gray scale mask in accordance with Modification 1 of Embodiment 1.

FIG. 12 illustrates the gray scale mask 120 in accordance with Modification 1 of Embodiment 1. The gray scale mask 120 in Modification 1 includes in a second area 122 a unit cell having an area aperture rate in a range other than a range where an area aperture rate and the resist depth are in a substantially proportional relation.

A case that the quantity of the transmitted light is made substantially zero all over the second area 122 is considered, for example. The light in the quantity corresponding to the resist depth is transmitted at a point P1 in a first area 91. The quantity of the transmitted light is substantially zero at a point P3 in the second area 122. At a point P2 on a border between the first area 91 and the second area 122, the quantity of the transmitted light suddenly varies from a finite value in the first area 91 to substantially zero in the second area 122.

Figure 13:
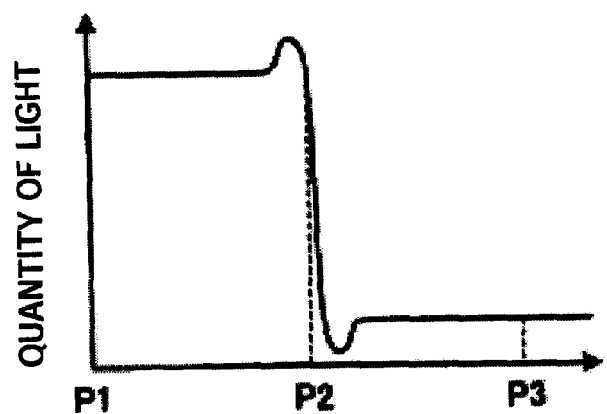
FIG. 13 illustrates quantity of light reaching a resist layer.
Figure 14:
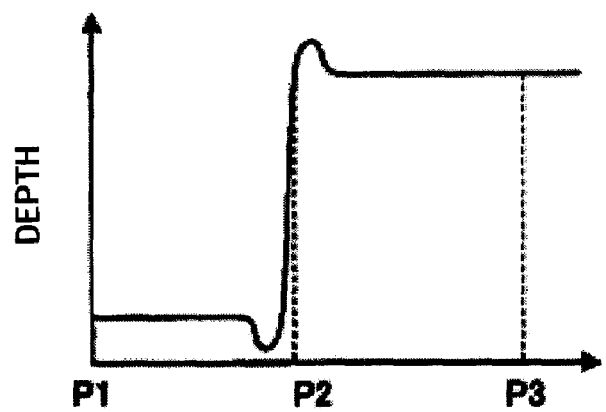
FIG. 14 illustrates a resist shape formed in a resist layer.

In this case, the quantity of light reaching the resist layer easily increases a little in a part corresponding to a point P1 side with respect to the point P2 and decreases a little in a part corresponding to a point P3 side with respect to the point P2, as shown in FIG. 13. Such variation in quantity of the light reaching the resist layer causes a microtrench, which is a small depression or protrusion, to be formed on the resist layer as shown in FIG. 14. When the microtrench is formed due to a cause other than design as described above, it is difficult to form the second resist shape S2 with high accuracy.

Figure 15:
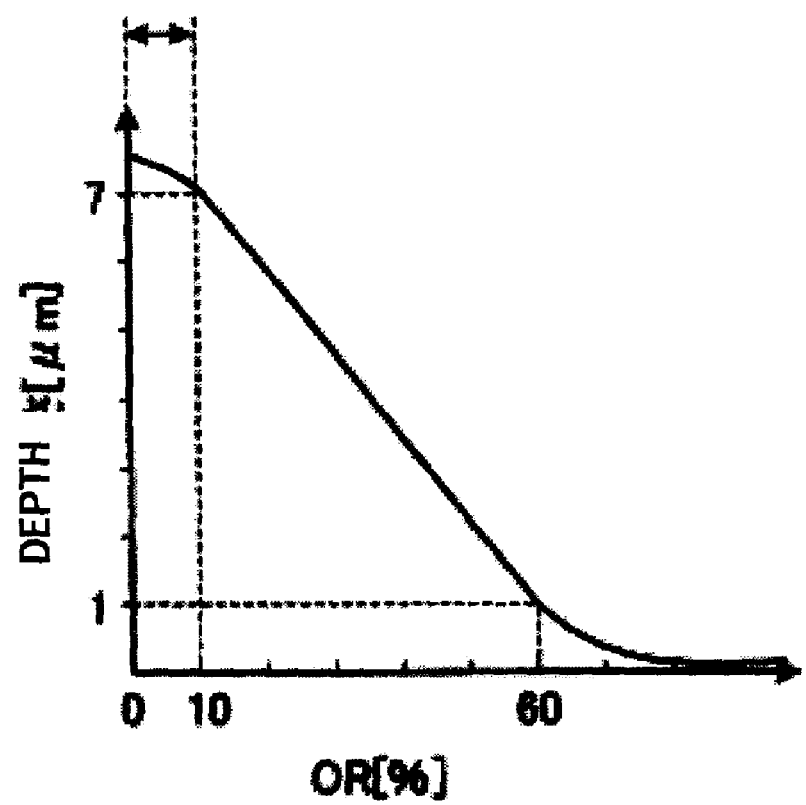
FIG. 15 illustrates an area aperture rate of a unit cell formed in a second area.

FIG. 15 illustrates the area aperture rate of a unit cell formed in the second area 122 of the gray scale mask 120 in Modification 1. The area aperture rate OR of a unit cell in the first area 91 is assumed to be in a range from 10% to 60% where the γ characteristic varies straight. On the other hand, the area aperture rate OR of a unit cell in the second area 122 is assumed to be a random value in a range from 0% to 10%. In the case of the γ characteristic shown in FIG. 15, variation of the resist depth decreases in the range of the area aperture rate OR from 0% to 10% regardless of the area aperture rate OR. The unit cell formed in the second area 122 is formed so that the area aperture rate OR of the unit cell would be in a range other than the range where the γ characteristic varies straight.

Figure 16:
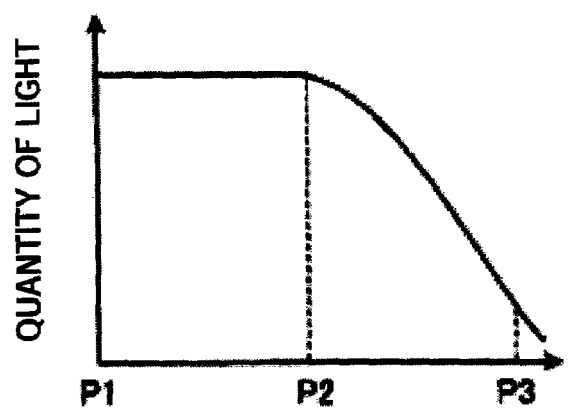
FIG. 16 illustrates quantity of light reaching a resist layer.
Figure 17:
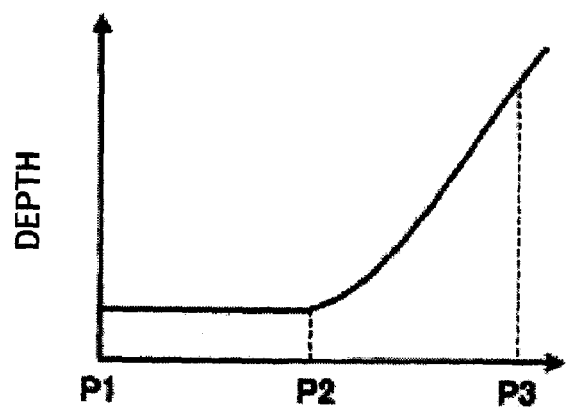
FIG. 17 illustrates a second resist shape formed in a resist layer.

FIG. 16 illustrates the quantity of the light reaching the resist layer in the case of using the gray scale mask 120 in Modification 1. In Modification 1, sudden variation in quantity of transmitted light is reduced at the point P2 of the gray scale mask 120 and the quantity of the light reaching the resist layer shows a gentle variation. Accordingly, a gentle curved surface can be formed on the resist layer as shown in FIG. 17. This prevents a microtrench from being formed, so that the second resist shape S2 can be formed with high accuracy.

Figure 18:
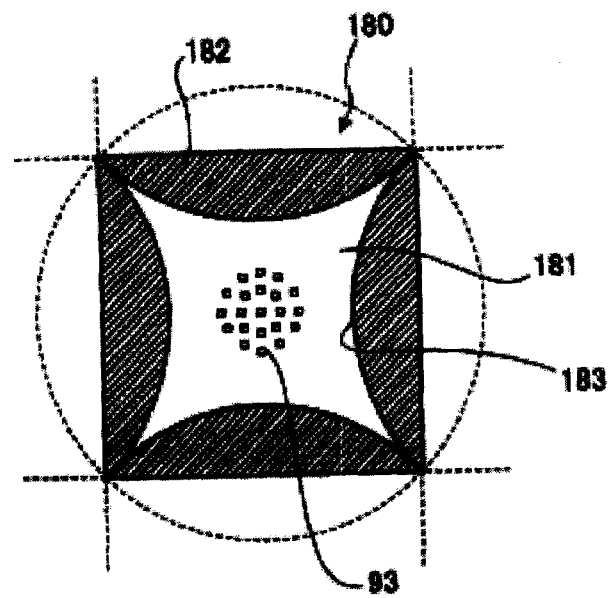
FIG. 18 illustrates a gray scale mask in accordance with Modification 2 of Embodiment 1.

FIG. 18 illustrates a gray scale mask 180 in accordance with Modification 2 of Embodiment 1. The gray scale mask 180 in Modification 2 includes a first area 181 in a different shape from the gray scale mask 20 (refer to FIG. 8). The gray scale mask 180 is assumed to comprise plural square-shaped mask areas for forming the second resist shape. A border between the first area 181 and a second area 182 in one mask area is an arc 183 of a circumscribed circle about another mask area adjacent to the former mask area. The first area 181 is formed in a part enclosed by four arcs 183 in a mask area.

The second area 182 is a part other than the first area 181 in a mask area. Including the first area 181 in such a shape allows a microlens having the shape whose center part is higher than the surrounding part to be formed. The first area 181 may be not only arranged to intercept the light from the light source 11 but also may be arranged to include a unit cell having the area aperture rate in a range other than a range where an area aperture rate and the resist depth are in a substantially proportional relation, similarly to the case of Modification 1. The resist depth of a part of the resist layer corresponding to the second area 182 may be made desirable by dividing the quantity of light into two of the light from one mask area and the light from another mask area adjacent to the former mask area.

Figure 19:
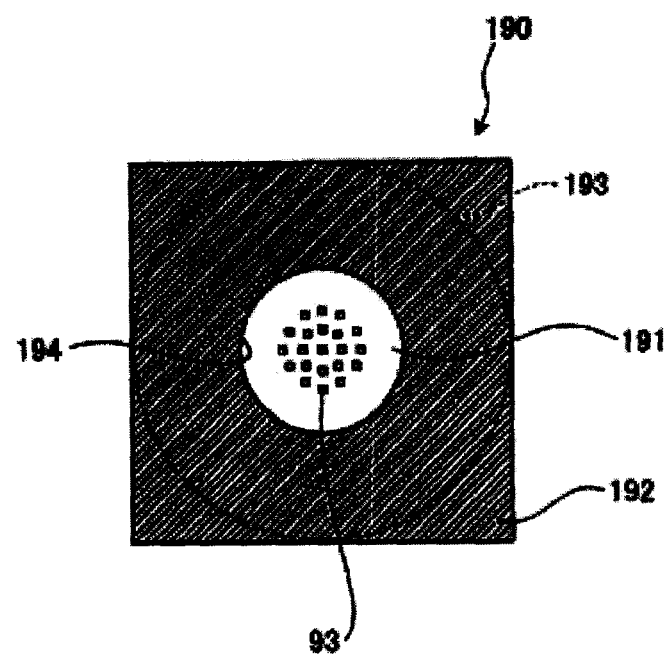
FIG. 19 illustrates a gray scale mask in accordance with Modification 3 of Embodiment 1.

FIG. 19 illustrates a gray scale mask 190 in accordance with Modification 3 of Embodiment 1. In Modification 3, a first area 191 is formed inside a circle 194 on the inner side of an inscribed circle 193 in a mask area. A center point of the circle 194 is accorded with a center point of the inscribed circle 193. A second area 192 is a part other than the first area 191 in a mask area. Including the first area 181 having such a shape allows a microlens to be formed into such a shape that the center part is higher than the peripheral part. The first area 191 is not limited to the one formed in the circle 194 so long as it is formed in a part inside the inscribed circle 193. The first area 191 may be not only arranged to intercept the light from the light source 11 but also may be arranged to include a unit cell having the area aperture rate in a range other than a range where an area aperture rate and the resist depth are in a substantially proportional relation, similarly to the case of Modification 1.

Embodiment 2

Figure 20:
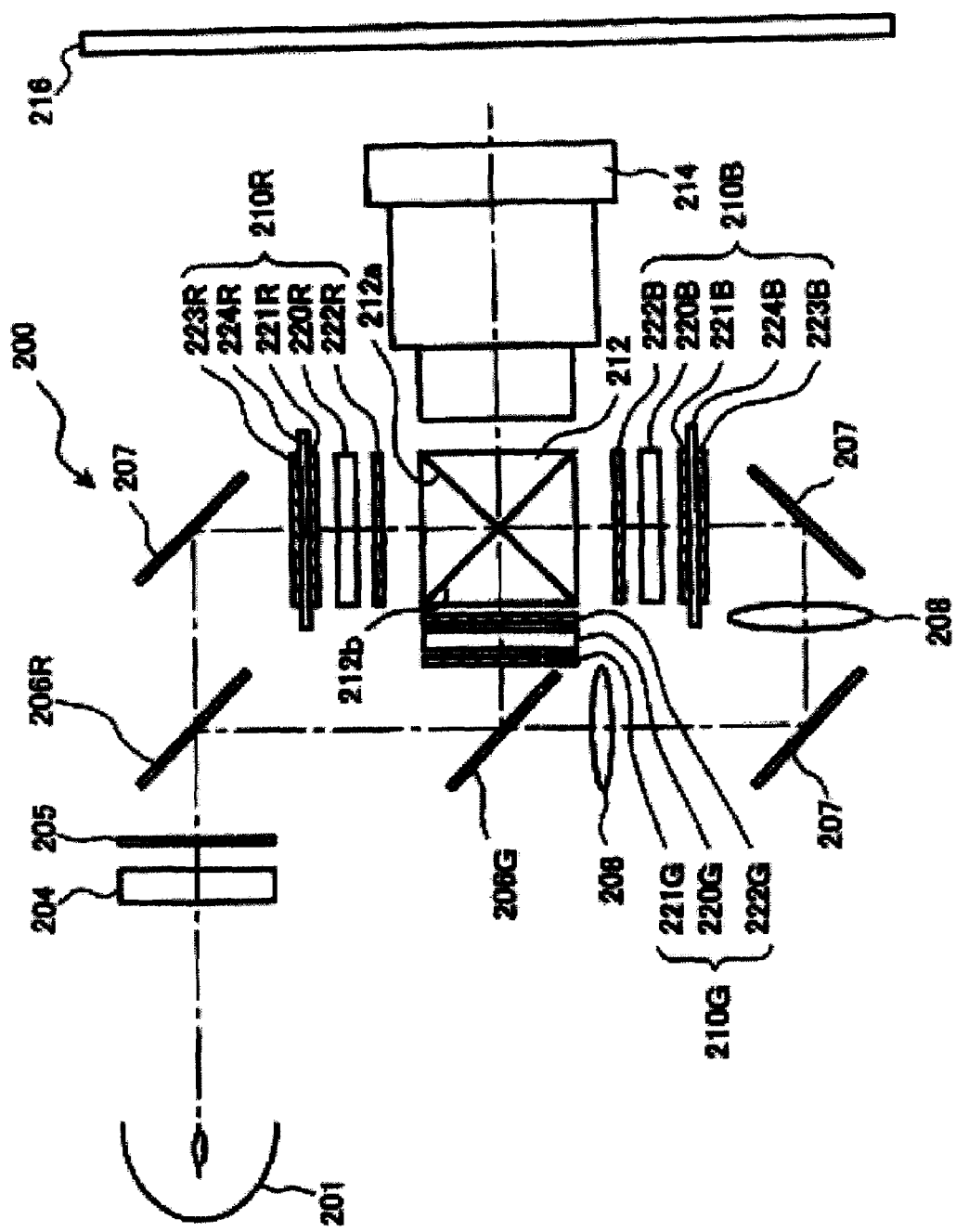
FIG. 20 shows a schematic structure of a projector in accordance with Embodiment 2 of the invention.

FIG. 20 shows a schematic structure of a projector 200 in accordance with Embodiment 2 of the invention. The projector 200 is characterized by comprising a microlens manufactured with the gray scale mask in Embodiment 1. The projector 200 is a so-called front projection type projector, which supplies a screen 216 provided on an observer side with light to observe the light reflected on the screen 216 for looking an image.

A light source part 201 is a super high pressure mercury lamp supplying light including the red light (referred to as "the light R", hereinafter), the green light (referred to as "the light G", hereinafter) and the blue light (referred to as "the light B", hereinafter). An integrator 204 evens illumination distribution of the light from the light source part 201. The light whose illumination distribution has been evened is converted into polarized light having a specific direction of oscillation, polarized light "s", for example, by means of a polarization converting element 205. The light converted into the polarized light "s" is incident on a light R transmission dichroic mirror 206R forming a color dividing optical system. The light source part 201 is not limited to a structure using the super high pressure mercury lamp. A solid light emitting element such as a light emitting diode element (LED) may be used, for example.

The light R transmission dichroic mirror 206R transmits the light R and reflects the light G and B. The light R penetrating the light R transmission dichroic mirror 206R is incident on a reflection mirror 207. The reflection mirror 207 bends an optical path of the light R at an angle of 90 degrees. The light R whose optical path has been bent is incident on a spatial light modulating apparatus 210R. The spatial light modulating apparatus 210R is a transmission type liquid crystal display device for modulating the light R in accordance with an image signal.

The spatial light modulating apparatus 210R comprises a λ/2 phase difference plate 223R, a glass plate 224R, a first polarizing plate 221R, a liquid crystal panel 220R and a second polarizing plate 222R. The λ/2 phase difference plate 223R and the first polarizing plate 221R are arranged so as to be in contact with the transmission type glass plate 224R, which does not convert the polarizing direction. This allows a problem that the first polarizing plate 221R and the λ/2 phase difference plate 223R are warped due to generation of heat to be prevented. The second polarizing plate 222R may be not only independently arranged but also arranged to be in contact with an exiting surface of the liquid crystal panel 220R or an incident surface of the cross dichroic prism 212.

The polarized light "s" incident on the spatial light modulating apparatus 210R is converted into polarized light "p" by means of the λ/2 phase difference plate 223R. The light R converted into the polarized light "p" penetrates the glass plate 224R and the first polarizing plate 221R as it is, and then, is incident on the liquid crystal panel 220R. The polarized light "p" incident on the liquid crystal panel 220R is converted into the polarized light "s" by modulation in accordance with an image signal. The light R converted into the polarized light "s" by modulation in the liquid crystal panel 220R exits from the second polarizing plate 222R. The light R modulated in the spatial light modulating apparatus 210R is thus incident on the cross dichroic prism 212, which is a color compound optical system.

The optical paths of the light G and B reflected on the light R transmission dichroic mirror 206R are bent at an angle of 90 degrees. The light G and B whose optical paths have been bent is incident on a light B transmission dichroic mirror 206G. The light B transmission dichroic mirror 206G reflects the light G and transmits the light B. The light G reflected on the light B transmission dichroic mirror 206G is incident on a spatial light modulating apparatus 210G. The spatial light modulating apparatus 210G is a transmission type liquid crystal display device for modulating the light G in accordance with an image signal. The spatial light modulating apparatus 210G comprises a liquid crystal panel 220G, a first polarizing plate 221G and a second polarizing plate 222G.

The light G incident on the spatial light modulating apparatus 210G has been converted into the polarized light "s". The polarized light "s" incident on the spatial light modulating apparatus 210G penetrates the first polarizing plate 221G as it is, and then, is incident on the liquid crystal panel 220G. The polarized light "s" incident on the liquid crystal panel 220G is converted into the polarized light "p" by modulation in accordance with an image signal. The light G converted into the polarized light "p" by modulation in the liquid crystal panel 220G exits from the second polarizing plate 222G. The light G modulated in the spatial light modulating apparatus 210G is thus incident on the cross dichroic prism 212, which is a color compound optical system.

The light B penetrating the light B transmission dichroic mirror 206G is incident on the spatial light modulating apparatus 210B via two relay lenses 208 and two reflection mirrors 207. The spatial light modulating apparatus 210B is a transmission type liquid crystal display device for modulating the light B in accordance with an image signal. The light B passes through the relay lenses 208 since the length of the optical path of the light B is longer than that of the light R and G. Using the relay lenses 208 allows the light B having penetrated the light B transmission dichroic mirror 206G to be guided as it is to the spatial light modulating apparatus 210B. The spatial light modulating apparatus 210B comprises a λ/2 phase difference plate 223B, a glass plate 224B, a first polarizing plate 221B, a liquid crystal panel 220B and a second polarizing plate 222B. A structure of the spatial light modulating apparatus 210B is similar to that of the above-mentioned spatial light modulating apparatus 210R. Accordingly, detailed description thereof is omitted.

The light B incident on the spatial light modulating apparatus 210B has been converted into the polarized light "s". The polarized light "s" incident on the spatial light modulating apparatus 210B is converted into the polarized light "p" by means of the λ/2 phase difference plate 223B. The light B having been converted into the polarized light "p" penetrates the glass plate 224B and the first polarized plate 221B as it is to be incident on the liquid crystal panel 220B. The polarized light "p" incident on the liquid crystal panel 220B is converted into the polarized light "s" by modulation in accordance with an image signal. The light B having been converted into the polarized light "s" by modulation in the liquid crystal panel 220B exits from the second polarizing plate 222B. The light B having been modulated by means of the spatial light modulation device 210B is incident on the cross dichroic prism 212, which is a color compound optical system.

The cross dichroic prism 212, which is a color compound optical system, comprises two dichroic films 212a and 212b arranged so as to cross at right angles into the shape of X. The dichroic film 212a reflects the light B and transmits the light G and R. The dichroic film 212b reflects the light R and transmits the light G and B. The dichroic prism 212 thus compounds the light R, G and B having been respectively modulated by means of the respective spatial light modulating apparatuses 210R, 210 G and 210B. A projection optical system 214 projects the light compounded by means of the cross dichroic prism 212 on a screen 216. This allows a full color image to be displayed on the screen 216.

As mentioned above, the light incident on the cross dichroic prism 212 from the spatial light modulating apparatus 210R and the spatial light modulating apparatus 210B is arranged to be formed into the polarized light "s". On the other hand, the light incident on the cross dichroic prism 212 from the spatial light modulating apparatus 210G is arranged to be formed into the polarized light "p". Making the polarizing direction of the light incident on the cross dichroic prism 212 different allows the light exiting from the respective spatial light modulating apparatuses to be effectively compounded in the cross dichroic prism 212. The dichroic films 212a and 212b are usually superior in reflection characteristic of the polarized light "s". Accordingly, the light R and B reflected on the dichroic films 212a and 212b is arranged to be the polarized light "s" while the light G penetrating the dichroic films 212a and 212b is arranged to be the polarized light "p".

Figure 21:
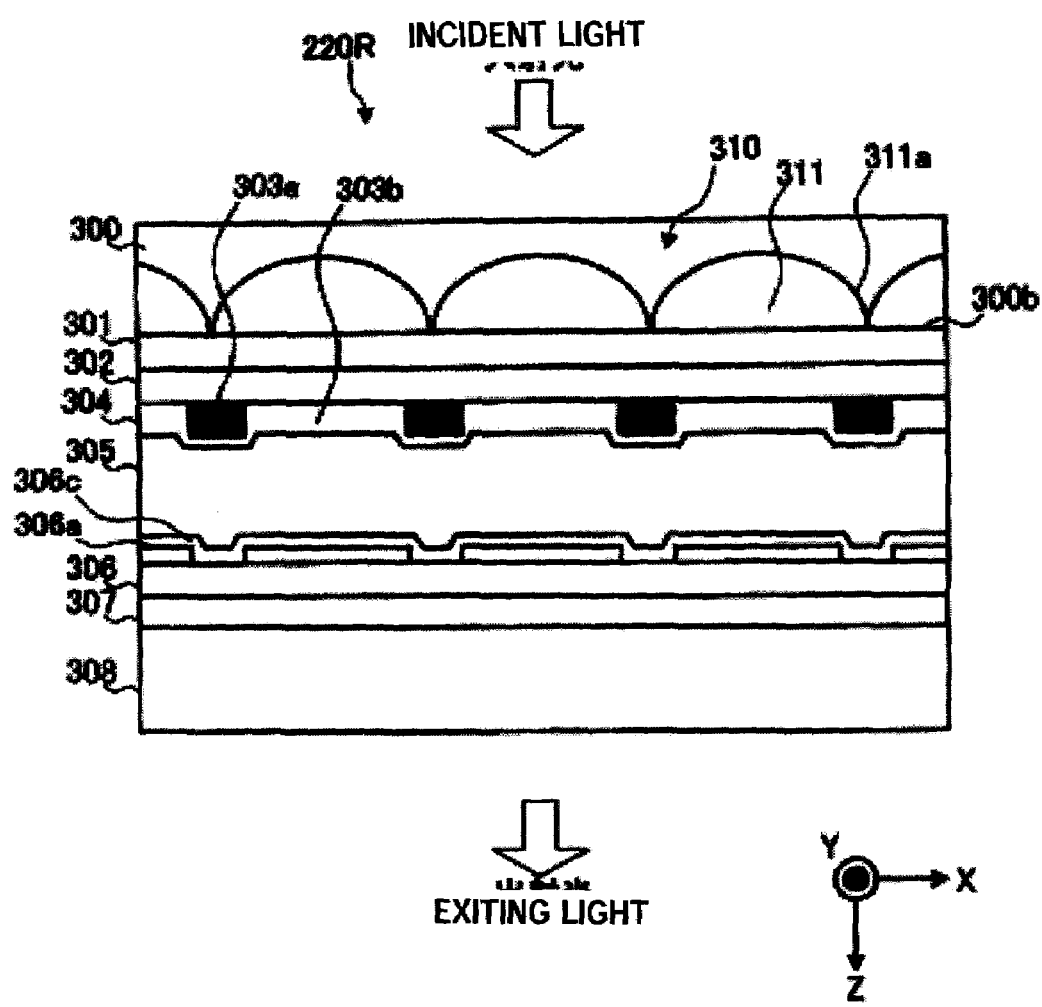
FIG. 21 shows a sectional structure of an integral part of a liquid crystal panel.

FIG. 21 shows a sectional structure of an integral part of the liquid crystal panel 220R. The projector 200 illustrated in FIG. 20 comprises three liquid crystal panels 220R, 220G and 220B. The three liquid crystal panels 220R, 220G and 220B are only different in range of the wavelength of the light for modulation and same in basic structure. Accordingly, the liquid crystal panel 220R is used as a representative example in the following description. The light R from the light source part 201 is incident on the liquid crystal panel 220R from the upper side shown in FIG. 21 to exit downward, namely, in a direction of the screen 216. On an incident side of an incident side dust-proofing glass 300, which is dust-proofing glass, fixed is a cover glass 302 through an adhesive layer 301. On an exit side of the cover glass 302, formed are a black matrix part 303a and an opposite electrode 304.

On the incident side of an exit side dust-proofing glass 308, formed are an adhesion layer 307, an aligning film 306c for aligning the liquid crystal and a TFT substrate 306 including a TFT (a thin film transistor) and a transparent electrode 306a. The incident side dust-proofing glass 300 and the exit side dust-proofing glass 308 are stuck with each other so that an opposite electrode 304 would be faced to the TFT substrate 306. A liquid crystal layer 305 is included between the opposite electrode 304 and the TFT substrate 306. The liquid crystal layer 305 is a modulation part for modulating the light R, which is the incident light, in accordance with an image signal. On the incident side of the liquid crystal layer 305, formed is a black matrix part 303a.

An opening part 303b makes the incident light incident on the liquid crystal layer 305, which is a modulating part. The light R penetrating the opening part 303b penetrates the opposite electrode 304, the liquid crystal layer 305 and the TFT substrate 306. The light R is converted in polarizing state by the modulation in accordance with the image signal in the liquid crystal layer 305. The opening part 303b forms a picture element of an image to be projected.

In the incident side dust-proofing glass 300, formed is a microlens array 310. The microlens array 310 includes a microlens 311 arranged in the shape of an array on a reference surface 300b, which is an X-Y plane. The microlens 311 refracts the light R, which is the incident light, toward the opening part 303b. The microlens 311 is provided so that a curved surface 311a for refracting light would be faced to the incident side. The liquid crystal panel 220R is arranged so that the reference surface 300b for providing the microlens 311 would cross with the z axis, which is an optical axis, at a substantially right angle.

In the structure shown in FIG. 20, the first polarizing plate 221R and the second polarizing plate 222R are provided separately from the liquid crystal panel 220R. Instead of the above, the polarizing plates may be provided between the incident side dust-proofing glass 300 and the opposite electrode 304 or between the exit side dust-proofing glass 308 and the TFT substrate 306. Further, the microlens array 310 may be formed on the first polarizing plate 221R.

The microlens 311 can be formed, using the gray scale mask in Embodiment 1. Using the gray scale mask in Embodiment 1 allows the microlens 311 to be formed with high accuracy, so that the structure can be made capable of accurately controlling a direction of progress of the light. In each spatial light modulating apparatus, accurately controlling the direction of progress of the light by means of the microlens 311 allows the light to be efficiently used. When the light can be efficiently used in each spatial light modulating apparatus, the projector 200 can display a bright image. Further, using the microlens 311 with the accurate shape allows the angle of a light beam to be accurately controlled, so that an image with a high contrast can be displayed. This allows an image, which is highly efficient and bright and has a high contrast, to be obtained. Moreover, preventing the light from concentrating at the opening part 303*b* by means of the microlens 311 with the accurate shape allows deterioration of the liquid crystal, an alignment film or the like, and thereby, deterioration of a spatial light modulating apparatus to be reduced.

The projector 200 in Embodiment 2 is not limited to a structure using a super high pressure mercury lamp as the light source 201. A solid light emitting element such as a light emitting diode element (LED) may be used, for example. Further the projector 200 is not limited to a so-called three-plate type projector in which three transmission type liquid crystal display devices are provided. The projector 200 may be a projector provided with one transmission type liquid crystal display device or a projector using a reflection type liquid crystal display device, for example. Moreover, the projector 200 is not limited to a front projection type projector, but may be a so-called rear projector in which a laser beam is supplied on one surface of a screen while light exiting from the other surface of the screen is observed for looking an image. In addition, the microlens array 310 is not limited to be applied to a projector, but may be applied to a light receiving element such as a CCD camera and a C-MOS sensor.

As described above, the gray scale mask in accordance with the embodiment of the invention is suitable for the case of manufacturing a microlens in the shape with high aspect ratio.

The entire disclosure of Japanese Application No. 2005-345290, filed Nov. 30, 2005 is expressly incorporated by reference herein.

What is claimed is:

1. A gray scale mask for exposing a resist layer, the gray scale mask comprising:
    distribution of light transmittance determined so that the resist layer having been exposed in accordance with a first resist shape is used to form a predetermined second resist shape with an aspect ratio higher than the aspect ratio of the first resist shape;
    a first area having the distribution of light transmittance varied in accordance with the second resist shape for forming the second resist shape; and
    a second area for intercepting light for exposing the resist layer,
    the second area forming an inscribed circle that encloses the first area.

2. The gray scale mask according to claim 1, including plural unit cells provided with an opening part and a light shielding part, wherein the light transmittance is determined in accordance with an aperture area rate, the aperture area rate being a rate of the area of the opening part for the unit cell, the gray scale mask comprising:
    a first area having the aperture area rate of the unit cell varied in accordance with the second resist shape; and
    a second area having the unit cell with the area aperture rate in a range other than a range, the latter range where the area aperture rate and the resist depth are in a substantially proportional relation.

3. The gray scale mask according to claim 1, comprising plural mask areas for respectively forming the second resist shape, wherein
    the first area is formed in a part of one mask area, the part being enclosed by an arc of a circumscribed circle about another mask area adjacent to the former mask area.

4. The gray scale mask according to claim 1, comprising a mask area for forming the second resist shape, wherein
    the first area is formed in a part of an inscribed circle in the mask area.

5. A method of manufacturing a microlens, comprising:
    exposing a resist layer with a first gray scale mask having distribution of light transmittance determined in accordance with a first resist shape;
    exposing the resist layer with a second gray scale mask having distribution of light transmittance determined so that a predetermined second resist shape having an aspect ratio higher than the aspect ratio of the first resist shape would be formed by means of the resist layer having been exposed in accordance with the first resist shape; and
    forming a lens shape by transcribing the second resist shape to another member.

6. A microlens manufactured with the gray scale mask according to claim 1.

7. A microlens manufactured in the method of manufacturing a microlens according to claim 5.

8. A spatial light modulating apparatus comprising the microlens according to claim 6.

9. A projector comprising the spatial light modulating apparatus according to claim 8.

10. A system for exposing a resist layer, the system comprising:
    a first gray scale mask having a first distribution of light transmittance that exposes the resist layer to form a first resist shape having a first aspect ratio; and
    a second gray scale mask having a second distribution of light transmittance for exposing the resist layer having the first resist shape to form a predetermined second resist shape having a second aspect ratio,
    the second aspect ratio being higher than the first aspect ratio, and
    the second distribution of light transmittance being determined based on a comparison of the first resist shape and the predetermined second resist shape.

* * * * *

UNITED STATES PATENT AND TRADEMARK OFFICE
CERTIFICATE OF CORRECTION

PATENT NO.      : 7,651,822 B2                                Page 1 of 1
APPLICATION NO. : 11/564078
DATED           : January 26, 2010
INVENTOR(S)     : Mizusako et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 471 days.

Signed and Sealed this

Twenty-eighth Day of December, 2010

David J. Kappos
*Director of the United States Patent and Trademark Office*